(12) United States Patent
Pickett et al.

(10) Patent No.: US 8,111,494 B2
(45) Date of Patent: Feb. 7, 2012

(54) MEMRISTOR-PROTECTION INTEGRATED CIRCUIT AND METHOD FOR PROTECTION OF A MEMRISTOR DURING SWITCHING

(75) Inventors: Matthew D. Pickett, San Francisco, CA (US); John Paul Strachan, Millbrae, CA (US); Muhammad Shakeel Qureshi, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 219 days.

(21) Appl. No.: 12/695,995

(22) Filed: Jan. 28, 2010

(65) Prior Publication Data

US 2011/0181347 A1    Jul. 28, 2011

(51) Int. Cl.
*H02H 9/08* (2006.01)
*H02H 3/08* (2006.01)
*H02H 9/02* (2006.01)
*H02H 9/00* (2006.01)

(52) U.S. Cl. .................. 361/93.9; 361/93.7; 361/57
(58) Field of Classification Search ............. 361/93.7, 361/93.9
See application file for complete search history.

(56) References Cited

U.S. PATENT DOCUMENTS

| 5,828,242 | A | * | 10/1998 | Danstrom | .............. 327/67 |
| 7,340,356 | B2 | | 3/2008 | Straznicky | |
| 7,593,249 | B2 | | 9/2009 | Fasoli et al. | |
| 2008/0089110 | A1 | | 4/2008 | Robinett et al. | |
| 2009/0244953 | A1 | | 10/2009 | Maejima | |
| 2009/0323394 | A1 | | 12/2009 | Scheuerlein | |

FOREIGN PATENT DOCUMENTS

WO    2009134291 A2    11/2009

* cited by examiner

*Primary Examiner* — Dharti Patel

(57) ABSTRACT

A memristor-protection integrated circuit. The memristor-protection integrated circuit includes a first current-bias circuit, a second current-bias circuit, an inverter, and a current limiter. The first and second current-bias circuits are configured to be coupled to first and second power-supply rails, respectively. The inverter is coupled to the first current-bias circuit and to the second current-bias circuit, and is configured to couple at least one memristor to at least one of the first current-bias circuit and the second current-bias circuit in response to an input signal applied to the inverter. The current limiter is coupled to the first current-bias circuit and coupled to the second current-bias circuit, and is configured to limit current flowing through the memristor.

15 Claims, 11 Drawing Sheets

MEMRISTOR-PROTECTION INTEGRATED CIRCUIT AND METHOD FOR PROTECTION OF A MEMRISTOR DURING SWITCHING

This invention has been made with government support under Contract No. HR0011-09-3-0001, awarded by Defense Advanced Research Projects Agency. The government has certain rights in the invention.

TECHNICAL FIELD

Embodiments of the present invention relate generally to the field of memristors, memristive integrated-circuit (IC) devices, and methods for protecting a memristor during switching of the memristor from one resistance state to another resistance state.

BACKGROUND

Scientists engaged in the research and development of high reliability electronic memories, such as random access memories (RAMs), and programmable logic, such as microprocessors, based on ICs are keenly interested in finding new means for storing and processing information in electronic devices having high reliability, such as ICs based on memristor technology. Thus, research scientists are actively pursuing new approaches for meeting these demands.

DESCRIPTION OF THE DRAWINGS

The accompanying drawings, which are incorporated in and form a part of this specification, illustrate embodiments of the technology and, together with the description, serve to explain the embodiments of the technology.

Figure 1:
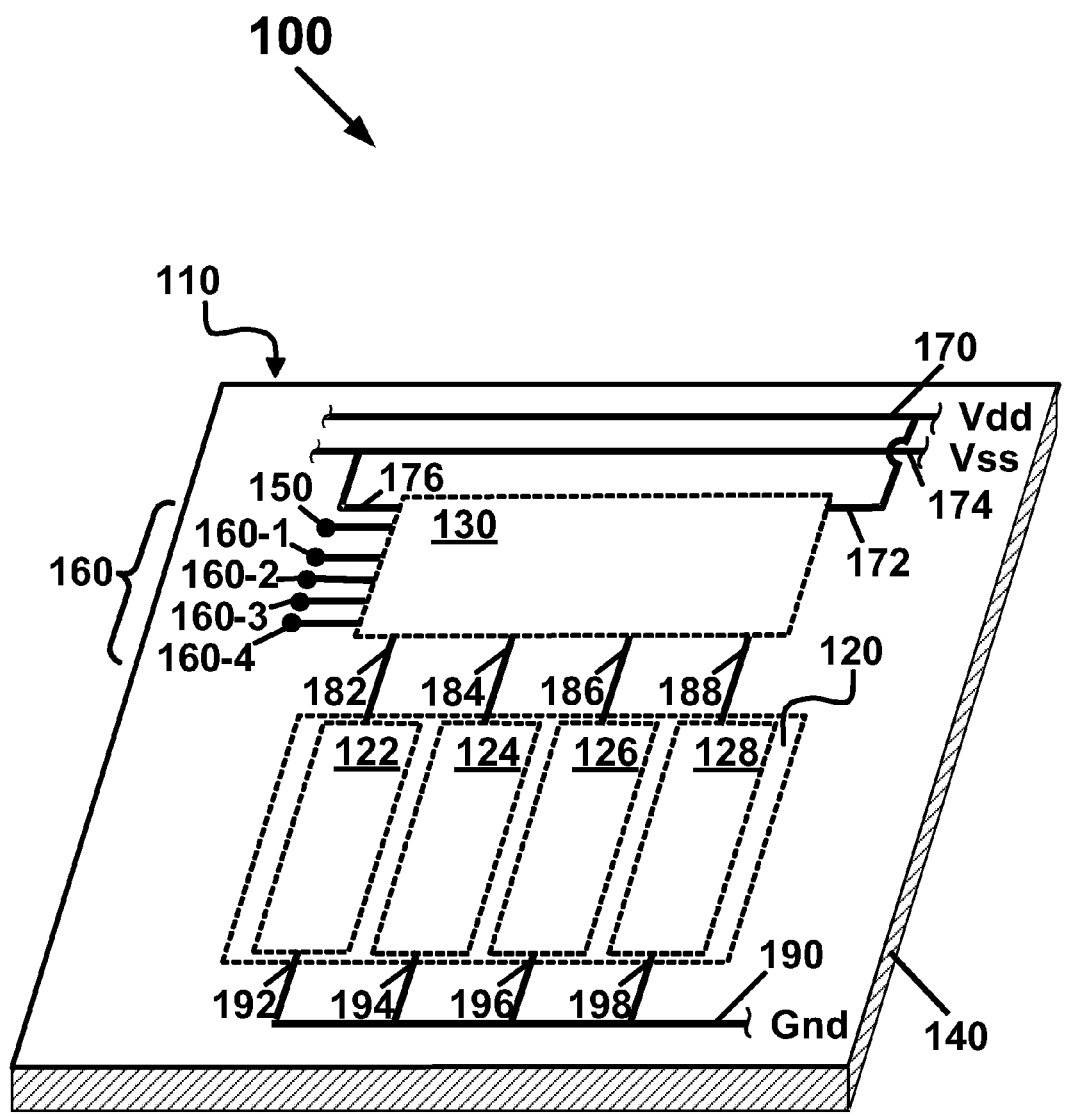
FIG. 1 is a perspective view of a memristive integrated-circuit (IC) device illustrating an example environment in which a memristor-protection IC is configured to protect at least one memristor in an array of memristors during switching, in accordance with embodiments of the present invention.

The drawings referred to in this description should not be understood as being drawn to scale except if specifically noted.

DESCRIPTION OF EMBODIMENTS

Reference will now be made in detail to the alternative embodiments of the present invention. While the technology will be described in conjunction with the alternative embodiments, it will be understood that they are not intended to limit the technology to these embodiments. On the contrary, the technology is intended to cover alternatives, modifications and equivalents, which may be included within the spirit and scope of the technology as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary.

Embodiments of the present invention include a memristor-protection integrated circuit (IC). The memristor-protection IC includes a first current-bias circuit, a second current-bias circuit, an inverter, and a current limiter. The first and second current-bias circuits are configured to be coupled to first and second power-supply rails, respectively. The inverter is coupled to the first current-bias circuit and to the second current-bias circuit, and is configured to couple at least one memristor to at least one of the first current-bias circuit and the second current-bias circuit in response to an input signal applied to the inverter. The current limiter is coupled to the first current-bias circuit and coupled to the second current-bias circuit, and is configured to limit current flowing through the memristor.

With reference now to FIG. 1, in accordance with embodiments of the present invention, a perspective view 100 is shown of a memristive IC device 110 including at least one memristor 122 in an array 120 of memristors 122, 124, 126 and 128. FIG. 1 also illustrates the functional arrangement in the memristive IC device 110 of a memristor-protection IC 130 that is configured to protect at least one memristor 122 in the array 120 during switching of the memristor 122. Although the memristive IC device 110 shown in FIG. 1 is shown as including at least one memristor-protection IC 130, in accordance with embodiments of the present invention, the memristive IC device 110 may include more than one memristor-protection IC 130. Moreover, even though the array 120 of memristors 122, 124, 126 and 128 in the memristive IC device 110 may be suggestive of a memory array, for example, as may be used in a random access memory (RAM), this is by way of example without limitation thereto, as embodiments of the present invention also include within their spirit and scope an array of memristors selected from the group consisting of a logic array, and a memory array. Also, in accordance with embodiments of the present invention, the array 120 of memristors 122, 124, 126 and 128 may be configured for neuromorphic computing, digital computing, as well as binary digital computing. Thus, in accordance with embodiments of the present invention, the memristive IC device 110 is not limited to memory devices as other IC environments are also within the spirit and scope of embodiments of the present invention. Furthermore, embodiments of the present invention for the memristor-protection IC 130, which are subsequently described in greater detail (not shown in FIG. 1, but shown and later described in the discussion of FIGS. 2 through 7D), apply to and may be incorporated within the environment of memristive IC device 110.

With further reference to FIG. 1, in accordance with embodiments of the present invention, the memristive IC device 110 includes at least one memristor, for example, memristor 122 in the array 120 of memristors 122, 124, 126 and 128, and at least one memristor-protection IC 130 configured to protect the memristor during switching of the memristor. As shown in FIG. 1, the array 120 includes memristors 122, 124, 126 and 128, by way of example without limitation thereto, as the array 120 of memristors 122, 124, 126 and 128 may include more than one memristor, or alternatively, more than the four memristors shown in FIG. 1. In accordance with embodiments of the present invention, the memristive IC device 110 includes a substrate 140, for example, a semiconductor substrate such as silicon (Si); and thus, integrated circuitry of the memristive IC device 110 may include complementary-metal-oxide-semiconductor (CMOS) silicon integrated circuitry. As used herein, the term of art, "integrated circuit," or "IC," may refer to circuitry integrated in diverse blocks of circuitry on the substrate 140; but, the term of art, "integrated circuit," or "IC," may also refer to "chips," which are fully integrated monolithic IC devices. Therefore, as shown in FIG. 1, in accordance with embodiments of the present invention, the memristor-protection IC 130 may include complementary-metal-oxide-semiconductor (CMOS) silicon integrated circuitry that includes circuitry integrated in a block of circuitry on the substrate 140. However, also within the spirit and scope of embodiments of the present invention, a memristor-protection IC may include a fully integrated monolithic IC device, for example, a separate chip.

With further reference to FIG. 1, in accordance with embodiments of the present invention, the memristor-protection IC 130 is coupled to a input-signal line 150, a first rail of a power supply, for example, an electrical-buss line 170 for Vdd through lead 172, and a second rail of a power supply, for example, an electrical-buss line 174 for Vss through lead 176; and, the memristor-protection IC 130 may also be coupled to a plurality 160 of address lines 160-1 160-2, 160-3 and 160-4; but, the memristor-protection IC 130 might not be coupled to an array of memristors, but rather, might be coupled to a single memristor, for example, similar to memristor 122 standing alone. For purposes of the following discussion, a first rail of a power supply is at a positive potential with respect to ground; and, a second rail of a power supply is at a negative potential with respect to ground; however, embodiments of the present invention are not limited to such polarities of the first and second rails of a power supply, as other polarities and different potentials with respect to ground are within the spirit and scope of embodiments of the present invention when appropriate changes in the polarities and biasing of the circuit components subsequently described are provided for. As shown in FIG. 1, if the memristor-protection IC 130 is coupled to a plurality 160 of address lines 160-1 160-2, 160-3 and 160-4, the plurality 160 of address lines 160-1 160-2, 160-3 and 160-4 may provide signals for demultiplexing the signal input on input-signal line 150 to individual memristors 122, 124, 126 and 128 in the array 120; and, the memristor-protection IC 130 is coupled to individual memristors 122, 124, 126 and 128 in the array 120 by lines 182, 184, 186 and 188, respectively, that provide both output from the memristor-protection IC 130 and input to the memristors 122, 124, 126 and 128. In one embodiment of the present invention, individual memristors 122, 124, 126 and 128 in the array 120 are coupled to electrical-buss line 190 for ground by leads 192, 194, 196 and 198, respectively; as shown in FIG. 1, the electrical-buss line 190 is a ground-buss line. In accordance with embodiments of the present invention, the signal input on input-signal line 150 may be a binary digital signal including a bit string of logical zeroes and ones, such that (for positive logic) a one corresponds to a high, or positive, voltage level, and a zero corresponds to a low, or negative, voltage level; alternatively, the signal input on input-signal line 150 may be a neuromorphic signal having a voltage level intermediate between a high and a low level, for example, as may be used in neuromorphic computing. In accordance with embodiments of the present invention, the memristive IC device 110 may include individual memristor-protection ICs using either type of signal input: a binary digital signal, or a neuromorphic signal. Depending on the type of signal input to a memristor-protection IC, for example, memristor-protection IC 130, the biasing scheme for the memristors and the memristor-protection IC may differ from the biasing scheme shown in FIG. 1, which is consistent with CMOS technology, as other biasing schemes and circuit technologies, for example, without limitation thereto, such as n-channel metal-oxide-semiconductor (nMOS) technology, p-channel metal-oxide-semiconductor (pMOS) technology and bipolar transistor based technologies, are also within the spirit and scope of embodiments of the present invention. However, as subsequently described, specific circuit implementations for various circuit blocks in the memristor-protection IC 130 are described as being implemented in CMOS technology, for example, based on Si. Moreover, the circuit blocks of the memristive IC device 110 as shown in FIG. 1 are by way of example without limitation thereto, as other circuit blocks (not shown), which are also within the spirit and scope of embodiments of the present invention, may also be included in the memristive IC device 110, for example, read-out circuitry (not shown) for reading out the states of memristors 122, 124, 126 and 128 in the array 120. A configuration of various circuit blocks within the memristor-protection IC 130 is next described.

Figure 2:
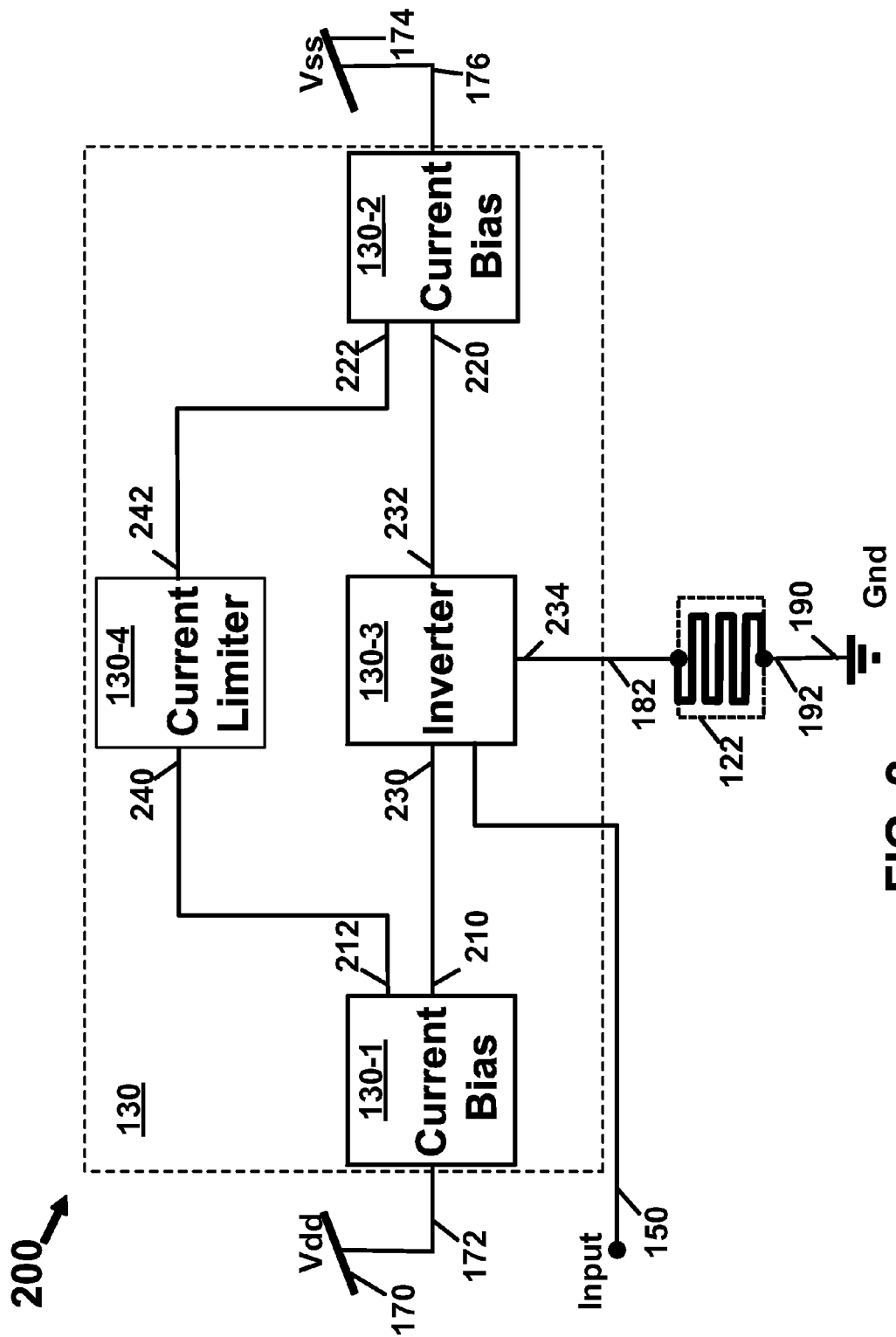
FIG. 2 is a block diagram of a first example memristor-protection IC illustrating the functional arrangement of circuit blocks in the memristor-protection IC shown in FIG. 1, in accordance with embodiments of the present invention.

With reference now to FIG. 2, in accordance with embodiments of the present invention, a block diagram 200 is shown for a first example of the memristor-protection IC 130. FIG. 2 illustrates a functional arrangement of circuit blocks in the memristor-protection IC 130 that is configured to limit current flowing through at least one memristor 122, as shown in FIG. 1. In accordance with embodiments of the present invention, the memristor-protection IC 130 includes a first current-bias circuit 130-1, a second current-bias circuit 130-2, an inverter 130-3, and a current limiter 130-4. The first current-bias circuit 130-1 is configured to be coupled to the first power-supply rail, for example, electrical-buss line 170 for Vdd through lead 172. The second current-bias circuit is configured to be coupled to the second power-supply rail, for example, electrical-buss line 174 for Vss through lead 176. The inverter 130-3 through lead 230 is coupled to the first current-bias circuit 130-1 through lead 210; and, the inverter 130-3 through lead 232 is also coupled to the second current-bias circuit 130-2 through lead 220. Moreover, the inverter 130-3 through output line 234 is configured to couple through line 182 at least one memristor, for example, memristor 122, to at least one of the first current-bias circuit 130-1 and the second current-bias circuit 130-2 in response to an input signal applied to the inverter 130-3 on input-signal line 150. Furthermore, the current limiter 130-4 through lead 240 is coupled to the first current-bias circuit 130-1 through lead 212; and, the current limiter 130-4 through lead 242 is coupled to the second current-bias circuit 130-2 through lead 222. In accordance with embodiments of the present invention, the current limiter 130-4 is configured to limit current flowing through the memristor, for example, memristor 122, which is connected to ground on electrical-buss line 190 by lead 192. In accordance with embodiments of the present invention, the current limiter 130-4 may include a circuit selected from the group consisting of a limiting resistor, a gated pair of limiting resistors, a potentiometer, an adaptive resistance, and a switch-capacitor, which are subsequently described in detail.

Figure 3:
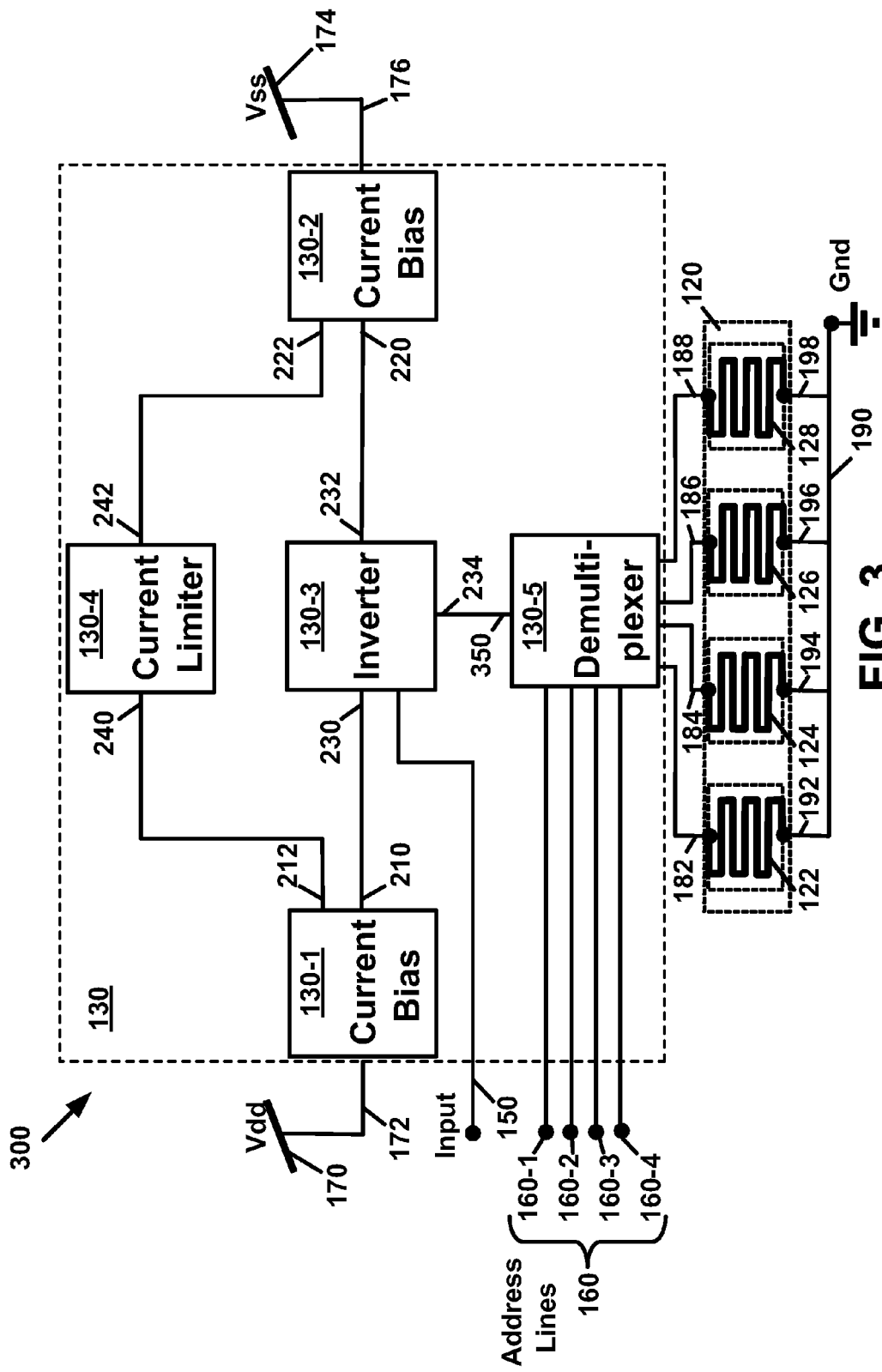
FIG. 3 is a block diagram of a second example memristor-protection IC illustrating an alternative functional arrangement of circuit blocks including a demultiplexer in the memristor-protection IC shown in FIG. 1, in accordance with embodiments of the present invention.

With reference now to FIG. 3, in accordance with embodiments of the present invention, a block diagram 300 is shown for a second example of the memristor-protection IC 130. FIG. 3 illustrates an alternative functional arrangement of circuit blocks including a demultiplexer 130-5 in the memristor-protection IC 130 that is configured to limit current flowing through at least one memristor, for example, one of memristors 122, 124, 126 and 128, in the array 120, as shown in FIG. 1. In accordance with embodiments of the present invention, the memristor-protection IC 130 of the second example includes a first current-bias circuit 130-1, a second current-bias circuit 130-2, an inverter 130-3, and a current limiter 130-4 that are interconnected as previously described in the discussion of FIG. 2; but, the memristor-protection IC 130 of the second example also further includes the demultiplexer 130-5. As described herein, a demultiplexer includes essentially the same internal circuitry as a multiplexer; the distinction between a demultiplexer and a multiplexer being that a demultiplexer connects a plurality of outputs to a single input, whereas a multiplexer connects a plurality of inputs to a single output; since electrical continuity is established for a signal flowing between input and output in either case, the same device may perform as a demultiplexer, as well as a multiplexer, depending on the direction of signal propagation during operation. Since the input signal to the memristor-protection IC 130 flows to memristors 122, 124, 126 and 128 in the array 120, the term of art demultiplexer is used herein. The demultiplexer 130-5 is configured to address at least one memristor, for example, one of memristors 122, 124, 126 and 128, in the array 120 in response to signals received on at least one address line, for example, one address line of the plurality 160 of address lines 160-1, 160-2, 160-3 and 160-4. Although FIGS. 1 and 3 might suggest that individual memristors 122, 124, 126 and 128 of the array 120 may be addressed in response to individual signals received on lines dedicated to each of the memristors, because the number of address lines of the plurality 160 is the same as the number of memristors in the array 120, this is by way of example without limitation thereto, as combinations of digital signals received on the address lines that allow addressing memristors in the array 120 with a lesser number of address lines than the number of memristors in the array 120 are also within the spirit and scope of embodiments of the present invention. In addition, the demultiplexer 130-5 is configured to couple at least one memristor, for example, one of memristors 122, 124, 126 and 128, in the array 120 to the inverter 130-3.

With further reference to FIG. 3, in accordance with another embodiment of the present invention, the demultiplexer 130-5 through lead 350 is coupled to the output line 234 of the inverter 130-3. Consequently, the combination of inverter 130-3 and demultiplexer 130-5 is configured: to couple through at least one line, for example, one of lines 182, 184, 186 and 188, to at least one memristor, for example, one of memristors 122, 124, 126 and 128 in the array 120; and, to couple at least one memristor, for example, one of memristors 122, 124, 126 and 128 in the array 120, to at least one of the first current-bias circuit 130-1 and the second current-bias circuit 130-2 in response to both an input signal applied to the inverter 130-3 on input-signal line 150 and signals received on at least one address line, for example, one address line of the plurality 160 of address lines 160-1, 160-2, 160-3 and 160-4. In accordance with embodiments of the present invention, the current limiter 130-4 is configured to limit current flowing through at least one memristor selected, as described above, by the demultiplexer 130-5 in the array 120; the memristors 122, 124, 126 and 128 that may be selected by the demultiplexer 130-5 are coupled to electrical-buss line 190 for ground by leads 192, 194, 196 and 198, respectively.

In the following discussion, except for the demultiplexer 130-5, for which internal circuit configurations are well known in the art, specific circuit configurations are subsequently described for components in the circuit blocks of the memristor-protection IC 130 including: the first current-bias circuit 130-1, the second current-bias circuit 130-2, the inverter 130-3, and the current limiter 130-4. In accordance with embodiments of the present invention, the circuit configurations, which are subsequently described, prevent an over-current condition leading to current run-away through the memristor from occurring during switching, and protect the memristor from short-circuit damage.

Figure 4:
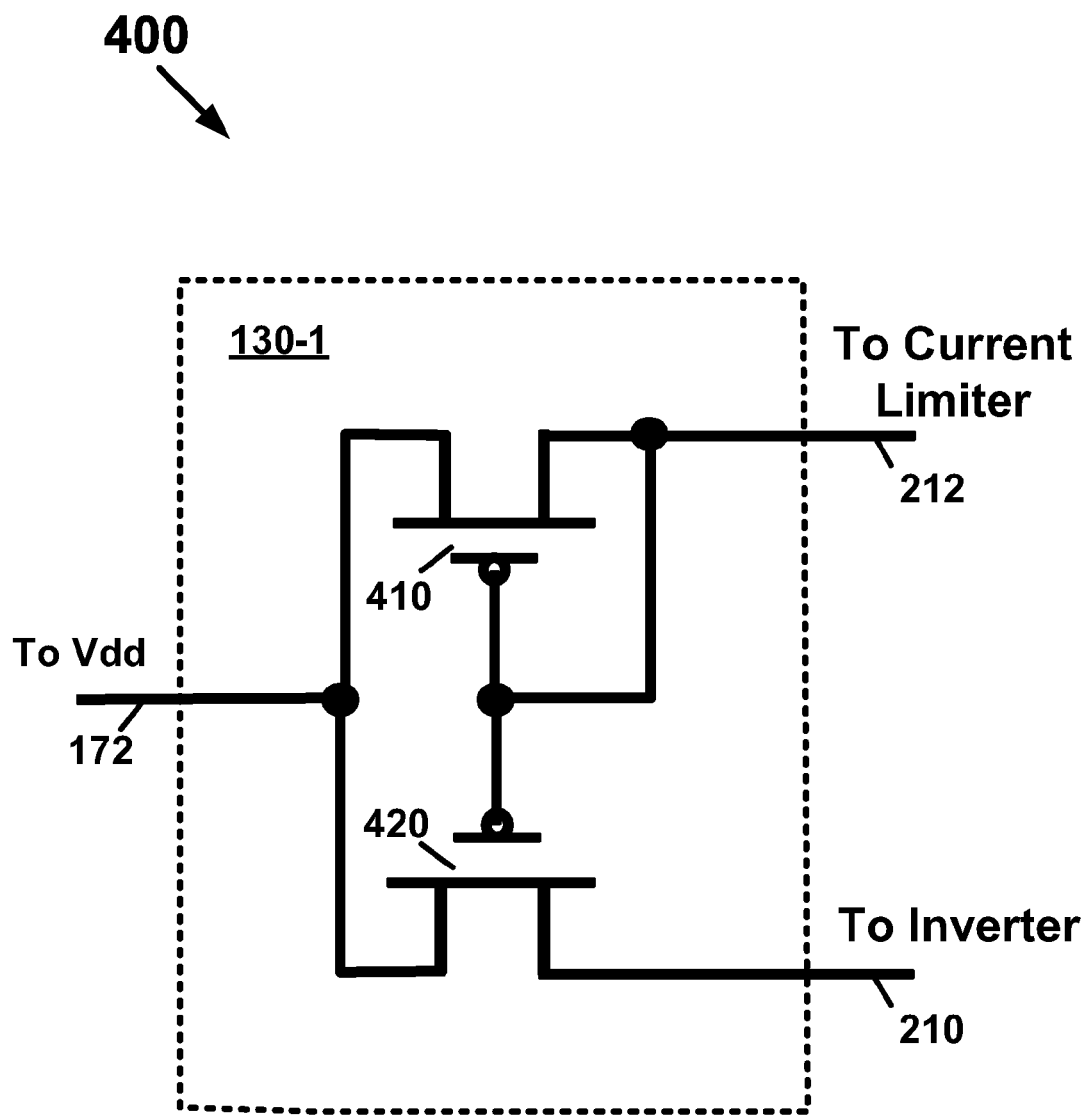
FIG. 4 is a circuit diagram of a circuit block shown in FIGS. 2 and 3 that includes an example first current-bias circuit including a first current mirror, in accordance with an embodiment of the present invention.

With reference now to FIG. 4, in accordance with one embodiment of the present invention, a circuit diagram 400 is shown for a circuit block of an example of the first current-bias circuit 130-1 that includes a first current mirror, which may be used in the memristor-protection IC 130 of FIGS. 2 and 3. By way of example without limitation thereto, in accordance with one embodiment of the present invention, the first current mirror may include two p-channel enhancement mode metal-oxide-semiconductor field effect transistors (MOSFETs) 410 and 420; the gates of the two p-channel enhancement mode MOSFETs 410 and 420 are coupled together in common; and, the sources of the two p-channel enhancement mode MOSFETs 410 and 420 are also coupled together in common. The common gates of the two p-channel enhancement mode MOSFETs 410 and 420 are coupled to lead 212 of the first current-bias circuit 130-1, which is coupled to the current limiter 130-4 through lead 240. The common sources of the two p-channel enhancement mode MOSFETs 410 and 420 are coupled to lead 172, which is coupled to the first rail of the power supply, for example, electrical-buss line 170 for Vdd. The drain of p-channel enhancement mode MOSFET 420 is coupled to lead 210, which is coupled to the inverter 130-3 through lead 230. The drain of p-channel enhancement mode MOSFET 410 is coupled to the common gates of the two p-channel enhancement mode MOSFETs 410 and 420 and to lead 212, which is coupled to the current limiter 130-4 through lead 240.

With further reference to FIG. 4, in accordance with another embodiment of the present invention, the circuit configuration of the two p-channel enhancement mode MOSFETs 410 and 420 provides a current mirror which limits the available current provided from the first rail of the power supply, for example, electrical-buss line 170 for Vdd, to the inverter 130-3 in proportion to a control current that flows through the current limiter 130-4. Thus, in accordance with embodiments of the present invention, the current available to switch the state of a memristor, for example, one of memristors 122, 124, 126 and 128, from the output line 234 of the inverter 130-3, which may be provided from the first rail of the power supply, for example, electrical-buss line 170 for Vdd, is limited by the action of the current mirror in proportion to the control current that flows through the current limiter 130-4.

Figure 5:
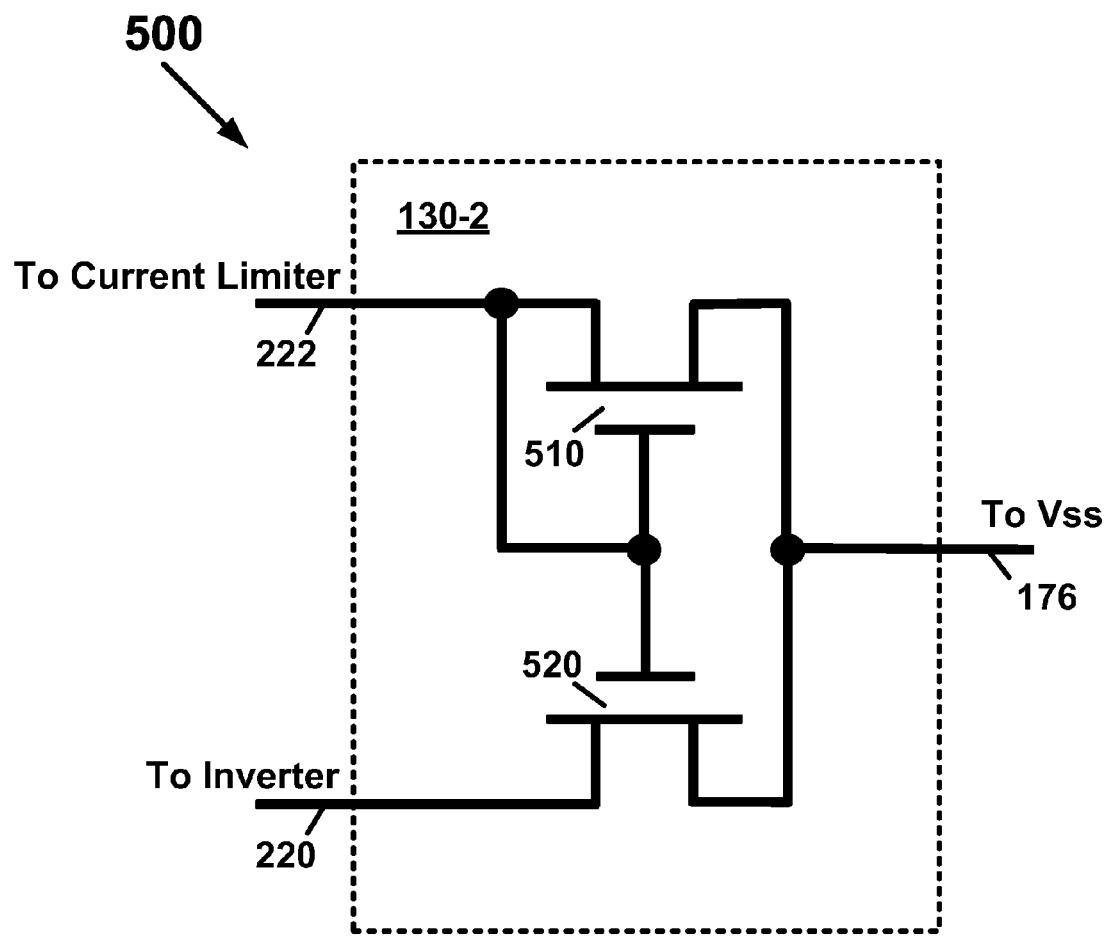
FIG. 5 is a circuit diagram of another circuit block shown in FIGS. 2 and 3 that includes an example second current-bias circuit including a second current mirror, in accordance with an embodiment of the present invention.

With reference now to FIG. 5, in accordance with another embodiment of the present invention, a circuit diagram 500 is shown for a circuit block of an example of the second current-bias circuit 130-2 that includes a second current mirror, which may be used in the memristor-protection IC 130 of FIGS. 2 and 3. By way of example without limitation thereto, in accordance with one embodiment of the present invention, the second current mirror may include two n-channel enhancement mode MOSFETs 510 and 520; the gates of the two n-channel enhancement mode MOSFETs 510 and 520 are coupled together in common; and, the sources of the two n-channel enhancement mode MOSFETs 510 and 520 are also coupled together in common. The common gates of the two n-channel enhancement mode MOSFETs 510 and 520 are coupled to lead 222 of the second current-bias circuit 130-2, which is coupled to the current limiter 130-4 through lead 242. The common sources of the two n-channel enhancement mode MOSFETs 510 and 520 are coupled to lead 176, which is coupled to the second rail of the power supply, for example, electrical-buss line 174 for Vss. The drain of n-channel enhancement mode MOSFET 520 is coupled to lead 220, which is coupled to the inverter 130-3 through lead 232. The drain of n-channel enhancement mode MOSFET 510 is coupled to the common gates of the two n-channel enhancement mode MOSFETs 510 and 520 and to lead 222, which is coupled to the current limiter 130-4 through lead 242.

With further reference to FIG. 5, in accordance with another embodiment of the present invention, the circuit configuration of the two n-channel enhancement mode MOSFETs 510 and 520 provides a current mirror which limits the available current provided from the second rail of the power supply, for example, electrical-buss line 174 for Vss, to the inverter 130-3 in proportion to a control current that flows through the current limiter 130-4. Thus, in accordance with embodiments of the present invention, the current available to switch the state of a memristor, for example, one of memristors 122, 124, 126 and 128, from the output line 234 of the inverter 130-3, which may be provided from the second rail of the power supply, for example, electrical-buss line 174 for Vss, is limited by the action of the current mirror in proportion to the control current that flows through the current limiter 130-4.

Figure 6:
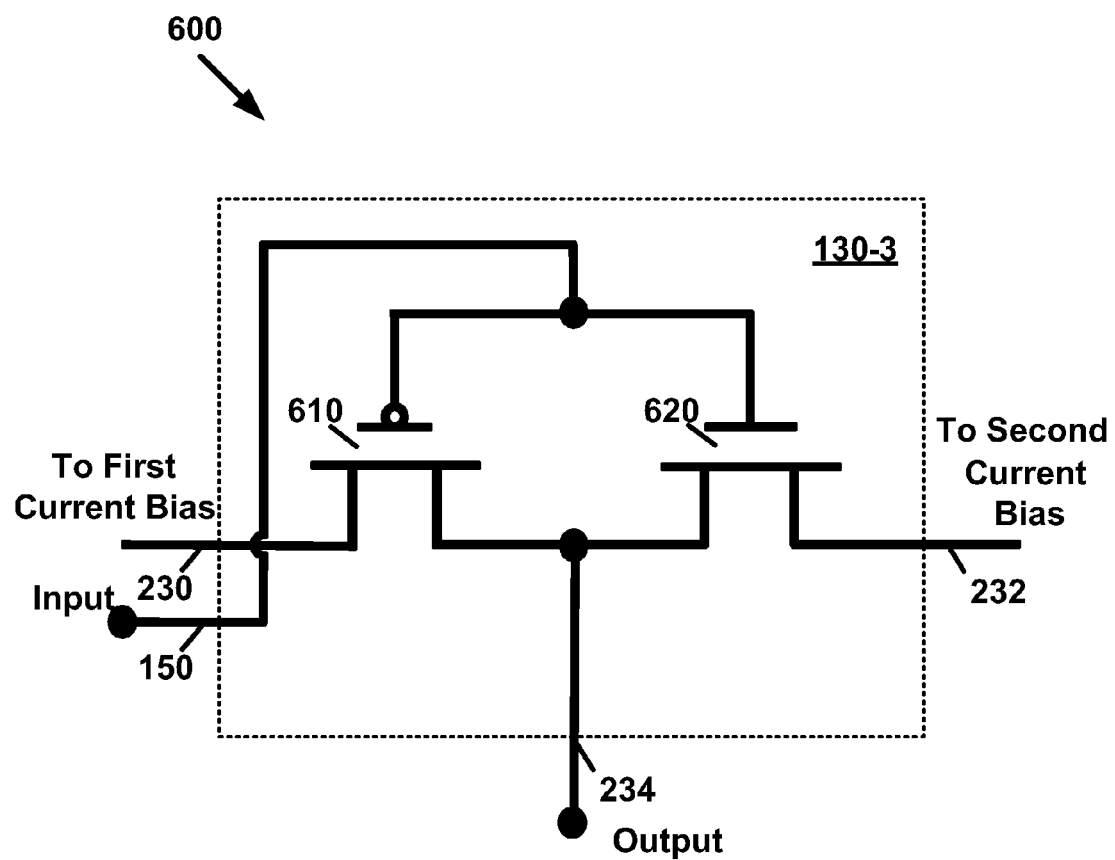
FIG. 6 is a circuit diagram of another circuit block shown in FIGS. 2 and 3 that includes an example inverter configured to couple at least one memristor to at least one of the first current-bias circuit and the second current-bias circuit, in accordance with an embodiment of the present invention.

With reference now to FIG. 6, in accordance with another embodiment of the present invention, a circuit diagram 600 is shown for a circuit block of an example of the inverter 130-3 that is configured to couple at least one memristor, for example, one of memristors 122, 124, 126 and 128, to at least one of the first current-bias circuit 130-1 and the second current-bias circuit 130-2 in response to an input signal applied to the inverter 130-3, which may be used in the memristor-protection IC 130 of FIGS. 2 and 3. By way of example without limitation thereto, in accordance with one embodiment of the present invention, the inverter 130-3 may include a p-channel enhancement mode MOSFET 610 and a n-channel enhancement mode MOSFET 620; the gates of the p-channel enhancement mode MOSFET 610 and the n-channel enhancement mode MOSFET 620 are coupled together in common; and, the drain of the p-channel enhancement mode MOSFET 610 and the drain of the n-channel enhancement mode MOSFET 620 are coupled together in common. The source of p-channel enhancement mode MOSFET 610 is coupled to lead 230 of the inverter 130-3, which is coupled to the first current-bias circuit 130-1 through the lead 210. The source of n-channel enhancement mode MOSFET 620 is coupled to lead 232 of the inverter 130-3, which is coupled to the second current-bias circuit 130-2 through the lead 220. The common gates of the p-channel enhancement mode MOSFET 610 and the n-channel enhancement mode MOSFET 620 are coupled to input-signal line 150 to the inverter 130-3. The drain of the p-channel enhancement mode MOSFET 610 and the drain of the n-channel enhancement mode MOSFET 620, which are coupled together in common, are coupled to output line 234 of the inverter 130-3. The circuit configuration of the p-channel enhancement mode MOSFET 610 and the n-channel enhancement mode MOSFET 620, as shown in FIG. 6, provides an inverter 130-3, which applies a voltage to a memristor, for example, one of memristors 122, 124, 126 and 128, coupled to the inverter 130-3 through the output line 234.

With further reference to FIG. 6, in accordance with another embodiment of the present invention, for a binary digital input signal, for example, a bit string of ones and zeroes, applied to input-signal line 150, the inverter 130-3 applies a voltage, which has opposite polarity to the polarity of the voltage of the input signal, to the output line 234 of the inverter 130-3, and drives the voltage on the output line 234 of the inverter 130-3 towards one or the other rail voltages of the power supply with a corresponding opposite polarity to the polarity of the voltage of the input signal. As used herein, the phrase, "drives the voltage on the output line 234 of the inverter 130-3 towards one or the other rail voltages of the power supply," does not necessarily imply that the voltage on the output line 234 of the inverter 130-3 actually saturates at one or the other rail voltages, as there may be a voltage drop between the rail voltages and the leads 210 and 220 of the first and second current-bias circuits 130-1 and 130-2, respectively, due to the action of the current mirrors included in the first and second current-bias circuits 130-1 and 130-2. Thus, in accordance with embodiments of the present invention, the voltage available from the output line 234 of the inverter 130-3 to switch the state of a memristor, for example, one of memristors 122, 124, 126 and 128, may be controlled: for example, a negative voltage to produce a high-resistance, OFF, state in the memristor, and a positive voltage to produce a low-resistance, ON, state in the memristor, which is suitable for digital computing. For a neuromorphic input signal, for example, a voltage level that may be less than a high level corresponding to a one and greater than a low level corresponding to zero (assuming positive logic), applied to input-signal line 150, the inverter 130-3 applies a voltage that is intermediate between the rail voltages of the power supply to the output line 234 of the inverter 130-3; thus, the inverter 130-3 behaves as a voltage divider between the rail voltages of the power supply and drives the voltage on the output line 234 of the inverter 130-3 to a value determined by the combination of source-to-drain resistances of the p-channel enhancement mode MOSFET 610 and the n-channel enhancement mode MOSFET 620, which may differ in response to the neuromorphic input signal. Thus, in accordance with embodiments of the present invention, the voltage available on the output line 234 of the inverter 130-3 to switch the state of a memristor, for example, one of memristors 122, 124, 126 and 128, may be controlled: for example, a intermediate voltage to produce an intermediate resistance state in the memristor, which is suitable for neuromorphic computing. At the same time that the voltage on the output line 234 of the inverter 130-3 is applied to the memristor, for example, one of memristors 122, 124, 126 and 128, the current flowing to the memristor from the output line 234 of the inverter 130-3 is limited by the action of the current mirrors of first and second current-bias circuits 130-1 and 130-2 in proportion to the control current that flows through the current limiter 130-4. Consequently, in accordance with embodiments of the present invention, an over-current condition leading to current run-away through a memristor, for example, one of memristors 122, 124, 126 and 128, can be prevented from occurring during switching of the memristor, such that the memristor is protected from short-circuit damage.

Figure 7A:
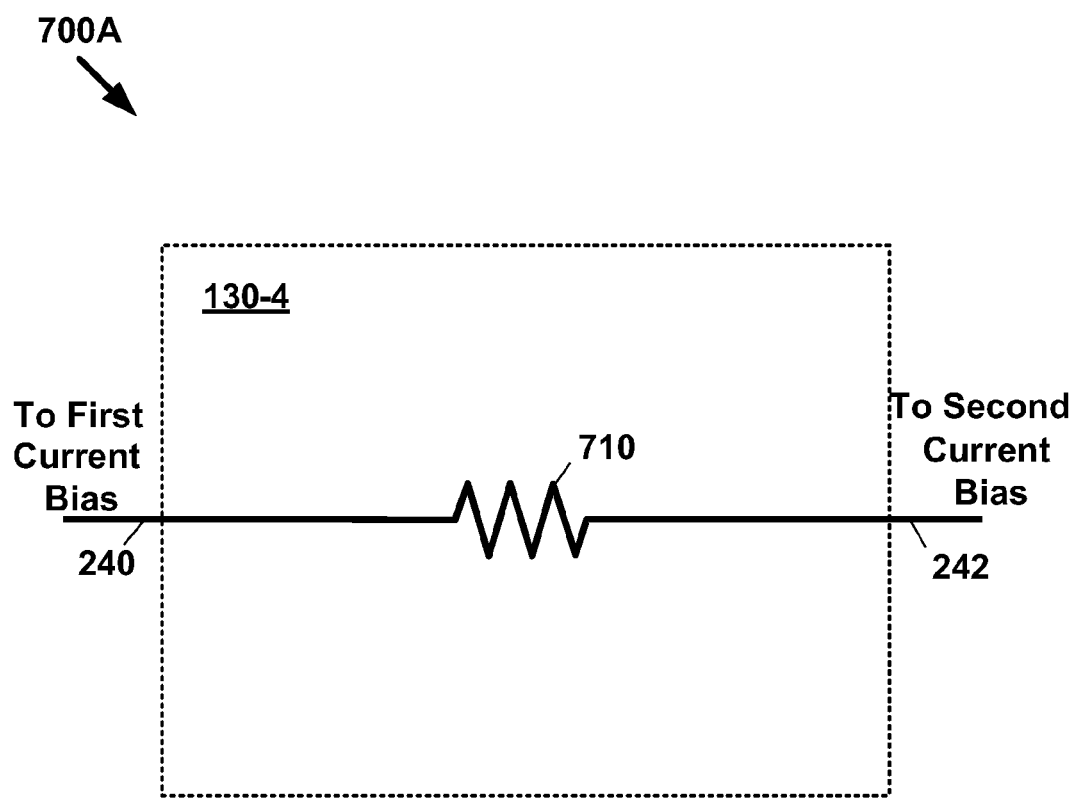
FIG. 7A is a circuit diagram of another circuit block shown in FIGS. 2 and 3 that includes an example current limiter including a limiting resistor configured to limit current flowing through the memristor, in accordance with an embodiment of the present invention.

With reference now to FIG. 7A, in accordance with another embodiment of the present invention, a circuit diagram 700A is shown for a circuit block of an example of the current limiter 130-4, which may be used in the memristor-protection IC 130 of FIGS. 2 and 3. As shown in FIG. 7A, by way of example without limitation thereto, in accordance with one embodiment of the present invention, the current limiter 130-4 includes a limiting resistor 710 that is configured to limit current flowing through the memristor, for example, one of memristors 122, 124, 126 and 128; one lead of the limiting resistor 710 is coupled to lead 240 of the current limiter 130-4, which is coupled to the first current-bias circuit 130-1 through the lead 212; and the other lead of the limiting resistor 710 is coupled to lead 242 of the current limiter 130-4, which is coupled to the second current-bias circuit 130-2 through the lead 222. In accordance with embodiments of the present invention, the current flowing to the memristor from the output line 234 of the inverter 130-3 is limited by the action of the current mirrors of first and second current-bias circuits 130-1 and 130-2 in proportion to the control current that flows through the current limiter 130-4 that is determined by the limiting resistor 710.

Figure 7B:
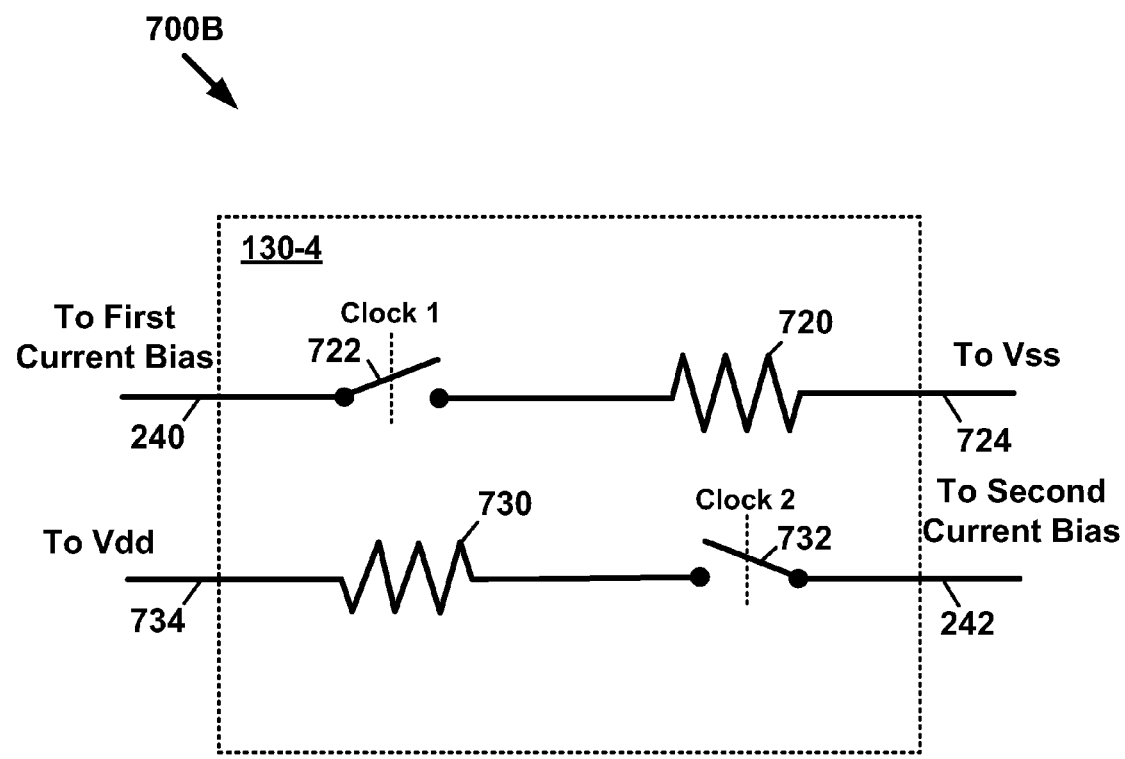
FIG. 7B is a circuit diagram of another circuit block shown in FIGS. 2 and 3 that includes an alternative example current limiter including a gated pair of limiting resistors configured to limit current flowing through the memristor, in accordance with an embodiment of the present invention.

With reference now to FIG. 7B, in accordance with another embodiment of the present invention, a circuit diagram 700B is shown for a circuit block of another example of the current limiter 130-4, which may be used in the memristor-protection IC 130 of FIGS. 2 and 3. As shown in FIG. 7B, by way of example without limitation thereto, in accordance with one embodiment of the present invention, the current limiter 130-4 includes a gated pair of limiting resistors 720 and 730 that are configured to limit current flowing through the memristor, for example, one of memristors 122, 124, 126 and 128; one lead of the first limiting resistor 720 of the pair is coupled to a first supplemental lead 724 of the current limiter 130-4, which is coupled to the second rail of the power supply, for example, electrical-buss line 174 for Vss; the other lead of the first limiting resistor 720 is coupled to one terminal of a first switch 722, which may include gated complementary MOSFETs configured as a CMOS transmission gate (not shown), that opens and closes in response to a first clock signal (clock 1); and, the other terminal of the first switch 722 is coupled to lead 240 of the current limiter 130-4, which is coupled to the first current-bias circuit 130-1 through the lead 212. As further shown in FIG. 7B, by way of example without limitation thereto, in accordance with one embodiment of the present invention, one lead of the second limiting resistor 730 of the pair is coupled to a second supplemental lead 734 of the current limiter 130-4, which is coupled to the first rail of the power supply, for example, electrical-buss line 170 for Vdd; the other lead of the second limiting resistor 730 is coupled to one terminal of a second switch 732, which may include gated complementary MOSFETs configured as a CMOS transmission gate (not shown), that opens and closes in response to a second clock signal (clock 2); and, the other terminal of the second switch 732 is coupled to lead 242 of the current limiter 130-4, which is coupled to the second current-bias circuit 130-2 through the lead 222. In accordance with an embodiment of the present invention, the current flowing to the memristor from the output line 234 of the inverter 130-3 is limited both by the action of the first current mirror of first current-bias circuit 130-1 in proportion to a control current that flows through the first limiting resistor 720 of the current limiter 130-4 that is determined by the closing of first switch 722 in response to the first clock signal (clock 1), and by the action of the second current mirror of second current-bias circuit 130-2 in proportion to a control current that flows through the second limiting resistor 730 of the current limiter 130-4 that is determined by the closing of second switch 732 in response to the second clock signal (clock 2).

Figure 7C:
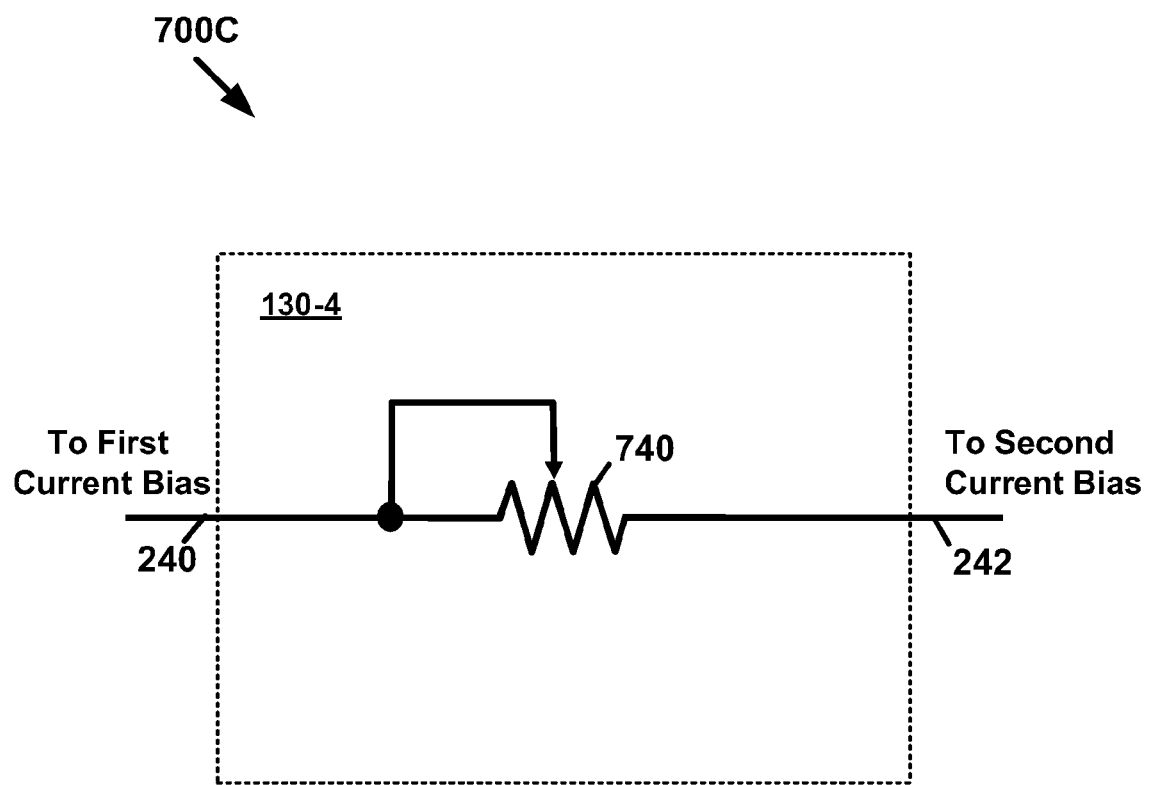
FIG. 7C is a circuit diagram of another circuit block shown in FIGS. 2 and 3 that includes another alternative example current limiter including an adaptive resistance, for example, a potentiometer, configured to limit current flowing through the memristor, in accordance with an embodiment of the present invention.

With reference now to FIG. 7C, in accordance with an embodiment of the present invention, a circuit diagram 700C is shown for a circuit block of another example of the current limiter 130-4, which may be used in the memristor-protection IC 130 of FIGS. 2 and 3. As shown in FIG. 7C, by way of example without limitation thereto, in accordance with one embodiment of the present invention, the current limiter 130-4 includes an adaptive resistance, for example, a potentiometer 740, that is configured to limit current flowing through the memristor, for example, one of memristors 122, 124, 126 and 128; one lead of the potentiometer 740 is coupled to lead 240 of the current limiter 130-4, which is coupled to the first current-bias circuit 130-1 through the lead 212; and the other lead of the potentiometer 740 is coupled to lead 242 of the current limiter 130-4, which is coupled to the second current-bias circuit 130-2 through the lead 222. In accordance with embodiments of the present invention, the current flowing to the memristor from the output line 234 of the inverter 130-3 is limited by the action of the current mirrors of first and second current-bias circuits 130-1 and 130-2 in proportion to the control current that flows through the current limiter 130-4 that is determined by the potentiometer 740.

Figure 7D:
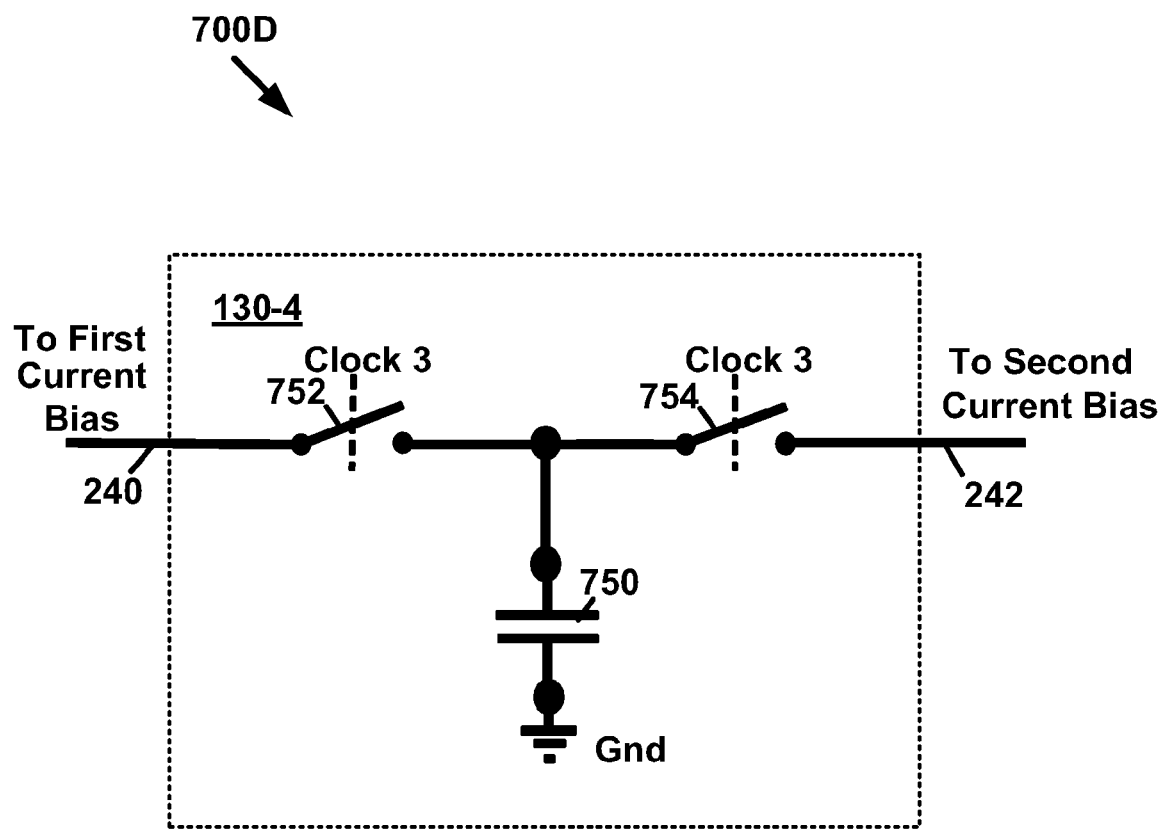
FIG. 7D is a circuit diagram of another circuit block shown in FIGS. 2 and 3 that includes another alternative example current limiter including a switch-capacitor configured to limit current flowing through the memristor, in accordance with an embodiment of the present invention.

With reference now to FIG. 7D, in accordance with another embodiment of the present invention, a circuit diagram 700D is shown for a circuit block of yet another example of the current limiter 130-4, which may be used in the memristor-protection IC 130 of FIGS. 2 and 3. As shown in FIG. 7D, by way of example without limitation thereto, in accordance with one embodiment of the present invention, the current limiter 130-4 includes a switch-capacitor, also referred to by the term of art, "switch-cap," that includes capacitor 750 and first and second switches 752 and 754, respectively, that is configured to limit current flowing through the memristor, for example, one of memristors 122, 124, 126 and 128; one lead of the capacitor 750 is coupled to ground; the other lead of the capacitor 750 is coupled in common to a second terminal of the first switch 752 and to a first terminal of the second switch 754. As further shown in FIG. 7D, by way of example without limitation thereto, in accordance with one embodiment of the present invention, the first terminal of the first switch 752, which may include gated complementary MOSFETs configured as a CMOS transmission gate (not shown) that open and close in response to a third clock signal (clock 3), is coupled to lead 240 of the current limiter 130-4, which is coupled to the first current-bias circuit 130-1 through the lead 212; the second terminal of the second switch 754, which may include gated complementary MOSFETs configured as a CMOS transmission gate (not shown) that also open and close in response to a third clock signal (clock 3), is coupled to lead 242 of the current limiter 130-4, which is coupled to the second current-bias circuit 130-2 through the lead 222. In accordance with an embodiment of the present invention, the current flowing to the memristor from the output line 234 of the inverter 130-3 is limited by the action of the first and second current mirrors of first and second current-bias circuits 130-1 and 130-2, respectively, in proportion to the control current that flows to the capacitor 750 of the current limiter 130-4 that is determined by the closing of switches 752 and 754 in response to the third clock signal (clock 3).

Figure 8:
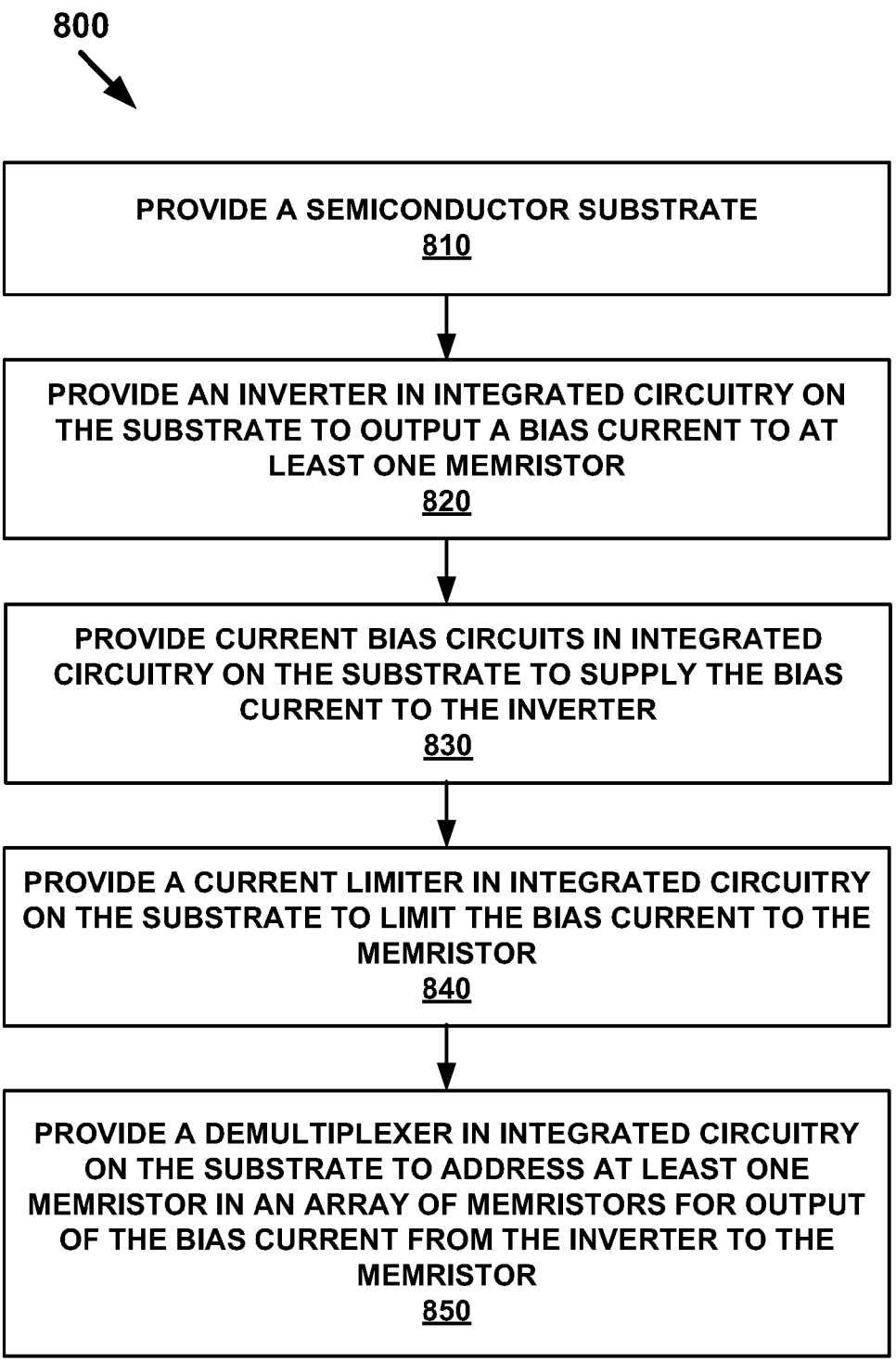
FIG. 8 is a flowchart of a method for protecting a memristor during switching of the memristor, in accordance with an embodiment of the present invention.

With reference now to FIG. 8, in accordance with an embodiment of the present invention, a flowchart 800 is shown of a method for protecting a memristor during switching of the memristor. The method for protecting the memristor during switching of the memristor includes the following. At 810, a semiconductor substrate is provided. At 820, an inverter is provided in integrated circuitry on the substrate to output a bias current to at least one memristor. At 830, current-bias circuits are provided in integrated circuitry on the substrate to supply the bias current to the inverter. At 840, a current limiter is provided in integrated circuitry on the substrate to limit the bias current to the memristor. The method may further include the following. At 850, a demultiplexer is provided in integrated circuitry on the substrate to address the at least one memristor in an array of memristors for output of the bias current from the inverter to the memristor.

The foregoing descriptions of specific embodiments of the present invention have been presented for purposes of illustration and description. They are not intended to be exhaustive or to limit the technology to the precise forms disclosed, and many modifications and variations are possible in light of the above teaching. The embodiments described herein were chosen and described in order to best explain the principles of the technology and its practical application, to thereby enable others skilled in the art to best utilize the technology and various embodiments with various modifications as are suited to the particular use contemplated. It may be intended that the scope of the technology be defined by the claims appended hereto and their equivalents.

What is claimed is:

1. A memristor-protection integrated circuit, comprising:
   a first current-bias circuit, said first current-bias circuit configured to be coupled to a first rail of a power supply;
   a second current-bias circuit, said second current-bias circuit configured to be coupled to a second rail of said power supply;
   an inverter, said inverter coupled to said first current-bias circuit and coupled to said second current-bias circuit, and said inverter configured to couple at least one memristor to at least one of said first current-bias circuit and said second current-bias circuit in response to an input signal applied to said inverter; and
   a current limiter, said current limiter coupled to said first current-bias circuit and coupled to said second current-bias circuit, said current limiter configured to limit current flowing through said memristor.

2. The memristor-protection integrated circuit of claim 1, further comprising:
   a demultiplexer, said demultiplexer configured to address said at least one memristor in an array of memristors, and configured to couple said at least one memristor in said array of memristors to said inverter.

3. The memristor-protection integrated circuit of claim 1, wherein said first current-bias circuit comprises a first current mirror.

4. The memristor-protection integrated circuit of claim 1, wherein said second current-bias circuit comprises a second current mirror.

5. The memristor-protection integrated circuit of claim 1, wherein said current limiter comprises a circuit selected from the group consisting of a limiting resistor, a gated pair of limiting resistors, a potentiometer, an adaptive resistance, and a switch-capacitor.

6. The memristor-protection integrated circuit of claim 1, wherein integrated circuitry of said memristor-protection integrated circuit comprises complementary-metal-oxide-semiconductor (CMOS) silicon integrated circuitry.

7. A memristive integrated-circuit device, comprising:
   at least one memristor; and
   at least one memristor-protection integrated circuit configured to protect said memristor during switching of said memristor, comprising:
      a first current-bias circuit, said first current-bias circuit coupled to a first rail of a power supply;
      a second current-bias circuit, said second current-bias circuit coupled to a second rail of said power supply;
      an inverter, said inverter coupled to said first current-bias circuit and coupled to said second current-bias circuit, and said inverter configured to couple said memristor to at least one of said first current-bias circuit and said second current-bias circuit in response to an input signal applied to said inverter; and
      a current limiter, said current limiter coupled to said first current-bias circuit and coupled to said second current-bias circuit, said current limiter configured to limit current flowing through said memristor.

8. The memristive integrated-circuit device of claim 7, wherein said memristor-protection integrated circuit further comprises:
   a demultiplexer, said demultiplexer configured to address said at least one memristor in an array of memristors, and configured to couple said at least one memristor in said array of memristors to said inverter.

9. The memristive integrated-circuit device of claim 7, wherein said first current-bias circuit comprises a first current mirror.

10. The memresistive integrated-circuit device of claim 7, wherein said second current-bias circuit comprises a second current mirror.

11. The memristive integrated-circuit device of claim 7, wherein said current limiter comprises a circuit selected from the group consisting of a limiting resistor, a gated pair of limiting resistors, a potentiometer, an adaptive resistance, and a switch-capacitor.

12. The memristive integrated-circuit device of claim 7, wherein integrated circuitry of said memristor-protection integrated circuit comprises complementary-metal-oxide-semiconductor (CMOS) silicon integrated circuitry.

13. The memristive integrated-circuit device of claim 7, further comprising:
   an array of memristors selected from the group consisting of a logic array, and a memory array; and
   wherein said array of memristors is configured for neuromorphic computing.

14. A method for protecting a memristor during switching of said memristor, said method comprising:

providing a semiconductor substrate;

providing an inverter in integrated circuitry on said substrate to output a bias current to at least one memristor;

providing current-bias circuits in integrated circuitry on said substrate to supply said bias current to said inverter; and providing a current limiter in integrated circuitry on said substrate to limit said bias current to said memristor.

15. The method of claim 14, said method further comprising:

providing a demultiplexer in integrated circuitry on said substrate to address said at least one memristor in an array of memristors for output of said bias current from said inverter to said memristor.

* * * * *

UNITED STATES PATENT AND TRADEMARK OFFICE
CERTIFICATE OF CORRECTION

PATENT NO.         : 8,111,494 B2                                Page 1 of 1
APPLICATION NO.    : 12/695995
DATED              : February 7, 2012
INVENTOR(S)        : Matthew D. Pickett et al.

It is certified that error appears in the above-identified patent and that said Letters Patent is hereby corrected as shown below:

In column 12, line 50, in Claim 10, delete "memresistive" and insert -- memristive --, therefor.

Signed and Sealed this
Sixth Day of November, 2012

David J. Kappos
*Director of the United States Patent and Trademark Office*